(12) United States Patent
Gomez-Iglesias et al.

(10) Patent No.: US 10,910,516 B2
(45) Date of Patent: *Feb. 2, 2021

(54) OPTOELECTRONIC SEMICONDUCTOR BODY AND METHOD FOR PRODUCING AN OPTOELECTRONIC SEMICONDUCTOR BODY

(71) Applicant: OSRAM OLED GMBH, Regensburg (DE)

(72) Inventors: Alvaro Gomez-Iglesias, Regensburg (DE); Asako Hirai, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/660,449

(22) Filed: Oct. 22, 2019

(65) Prior Publication Data

US 2020/0052153 A1 Feb. 13, 2020

Related U.S. Application Data

(63) Continuation of application No. 15/561,509, filed as application No. PCT/EP2016/056649 on Mar. 24, 2016, now Pat. No. 10,490,695.

(30) Foreign Application Priority Data

Mar. 26, 2015 (DE) .................. 10 2015 104 665

(51) Int. Cl.
*H01L 33/02* (2010.01)
*H01L 33/06* (2010.01)
(Continued)

(52) U.S. Cl.
CPC .......... *H01L 33/025* (2013.01); *H01L 33/007* (2013.01); *H01L 33/0095* (2013.01);
(Continued)

(58) Field of Classification Search
None
See application file for complete search history.

(56) References Cited

U.S. PATENT DOCUMENTS

| 4,644,553 A | 2/1987 | Van Ruyven et al. |
| 6,555,846 B1 | 4/2003 | Watanabe et al. |

(Continued)

FOREIGN PATENT DOCUMENTS

| CN | 1391293 A | 1/2013 |
| CN | 104362232 A | 2/2015 |

(Continued)

OTHER PUBLICATIONS

The First Office Action dated Nov. 5, 2018 of Chinese Application No. 201680018540.X.
(Continued)

*Primary Examiner* — Alexander G Ghyka
(74) *Attorney, Agent, or Firm* — MH2 Technology Law Group LLP

(57) ABSTRACT

The invention relates to an optoelectronic semiconductor element (100) comprising a semiconductor layer sequence (1) with a first layer (10) of a first conductivity type, a second layer (12) of a second conductivity type, and an active layer (11) which is arranged between the first layer (10) and the second layer (12) and which absorbs or emits electromagnetic radiation when operated as intended. The semiconductor element (100) is equipped with a plurality of injection regions (2) which are arranged adjacently to one another in a lateral direction, wherein the semiconductor layer sequence (1) is doped within each injection region (2) such that the semiconductor layer sequence (1) has the same conductivity type as the first layer (10) within the entire injection region (2). Each injection region (2) passes at least partly through the active layer (11) starting from the first layer (10). Furthermore, each injection region (2) is laterally (Continued)

Figure 1A:
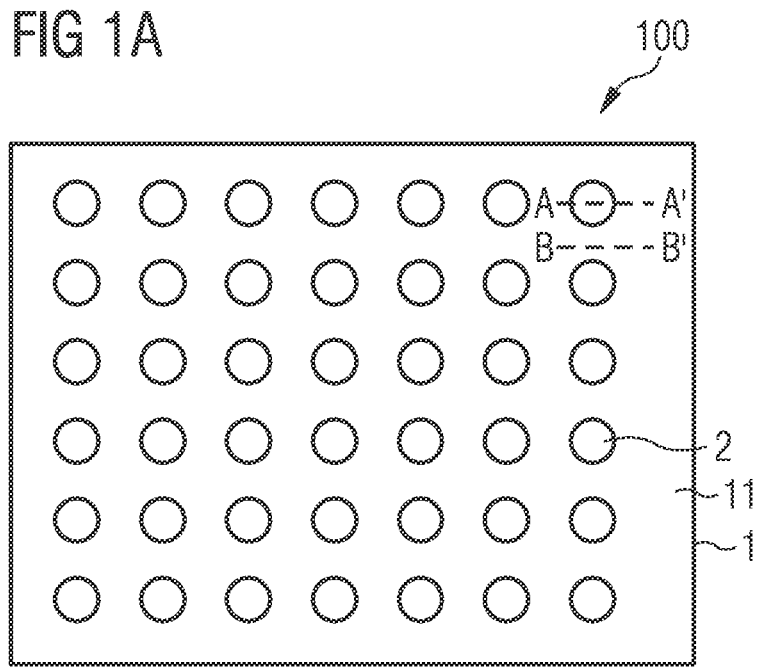

surrounded by a continuous path of the active layer (11), the active layer (11) being doped less in the path than in the injection region (2) or oppositely thereto. During the operation of the semiconductor element (100), charge carriers reach the injection regions (2) at least partly from the first layer (10) and are directly injected into the active layer (11) from there.

18 Claims, 4 Drawing Sheets

(51) Int. Cl.
*H01L 33/32* (2010.01)
*H01S 5/042* (2006.01)
*H01S 5/343* (2006.01)
*H01L 33/14* (2010.01)
*H01L 33/00* (2010.01)

(52) U.S. Cl.
CPC .............. *H01L 33/06* (2013.01); *H01L 33/14* (2013.01); *H01L 33/32* (2013.01); *H01S 5/0424* (2013.01); *H01S 5/34333* (2013.01)

(56) References Cited

U.S. PATENT DOCUMENTS

| | | | |
|---|---|---|---|
| 10,490,695 B2 * | 11/2019 | Gomez-Iglesias | H01L 33/32 |
| 2007/0057249 A1 | 3/2007 | Kim et al. | |
| 2011/0001121 A1 | 1/2011 | Ahn | |
| 2011/0121357 A1 | 5/2011 | Lester et al. | |
| 2011/0315952 A1 | 12/2011 | Yan et al. | |
| 2013/0050656 A1 | 2/2013 | Mochizuki | |
| 2013/0082273 A1 | 4/2013 | Ting | |
| 2015/0060762 A1 | 3/2015 | Kim et al. | |
| 2015/0115223 A1 | 4/2015 | Kwak et al. | |

FOREIGN PATENT DOCUMENTS

| | | |
|---|---|---|
| CN | 104425665 A | 3/2015 |
| DE | 60217943 T2 | 10/2007 |
| DE | 102012217640 A1 | 4/2014 |
| EP | 1927143 A2 | 6/2008 |
| EP | 2843714 A1 | 3/2015 |
| JP | H5251743 | 9/1993 |
| JP | H10-163576 | 6/1997 |
| JP | H10-163576 A | 6/1998 |
| JP | H11233814 | 8/1999 |
| JP | 2002368269 A | 12/2002 |
| JP | 2006339426 | 12/2006 |
| JP | 2007-081416 A | 3/2007 |
| JP | 2009-170604 A | 7/2009 |
| JP | 2009-170604 | 11/2009 |
| JP | 2013512567 | 5/2010 |
| JP | 20129810 | 1/2012 |
| JP | 2014518014 | 6/2012 |
| JP | 2015-046598 A | 3/2015 |
| TW | 558846 B | 10/2003 |
| TW | 200737626 A | 10/2007 |
| TW | 201019392 A1 | 5/2010 |
| WO | 2007031902 A2 | 3/2007 |
| WO | 2011066038 A1 | 6/2011 |
| WO | 2014048907 | 4/2014 |
| WO | 2014166764 | 10/2014 |

OTHER PUBLICATIONS

Notice of Reasons for Rejection dated Jul. 31, 2018 in Japanese Patent Application No. 2017-549466.
Second Office Action dated Jun. 28, 2019 in Chinese Patent Application No. 201680018540.X.
Third Office Action in Chinese Patent Application No. 201680018540.X dated Sep. 24, 2019.
Poole et al., "The enhancement of quantum well intermixing through repeated ion implantation", Semiconductor Science and Technology, 1994, vol. 9, No. 11, 5 pages.
Notice of Reasons for Rejection in corresponding Japanese Application No. 2019-087727 dated Jul. 28, 2020, 7 pages.

* cited by examiner

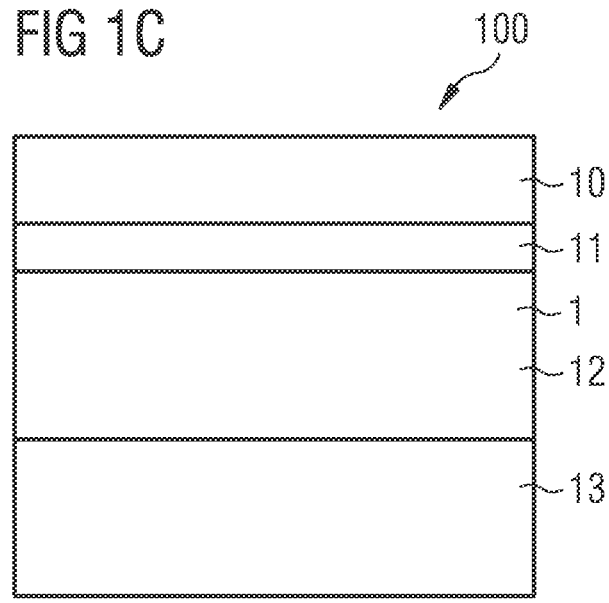
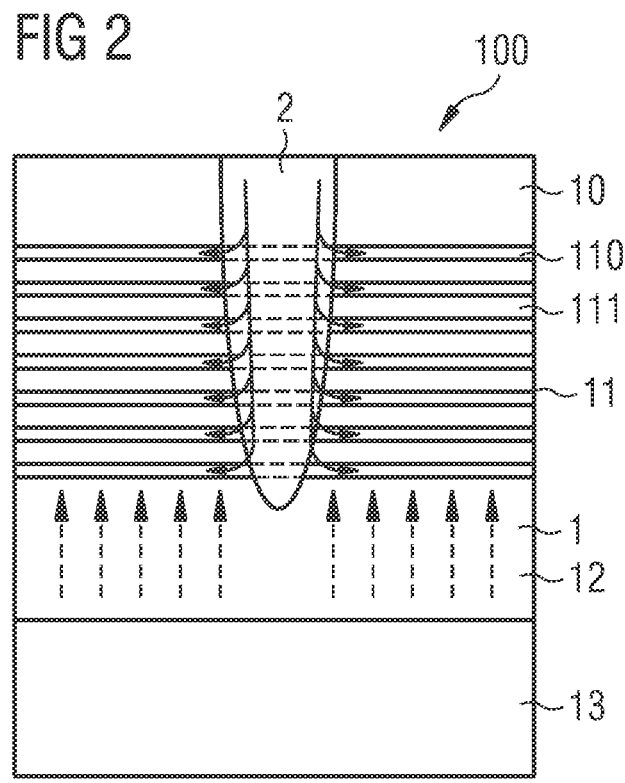

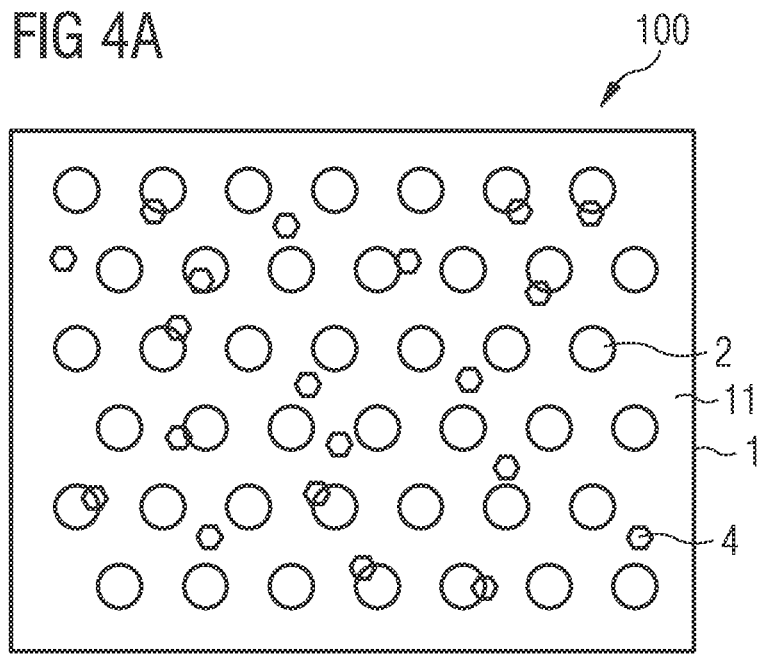
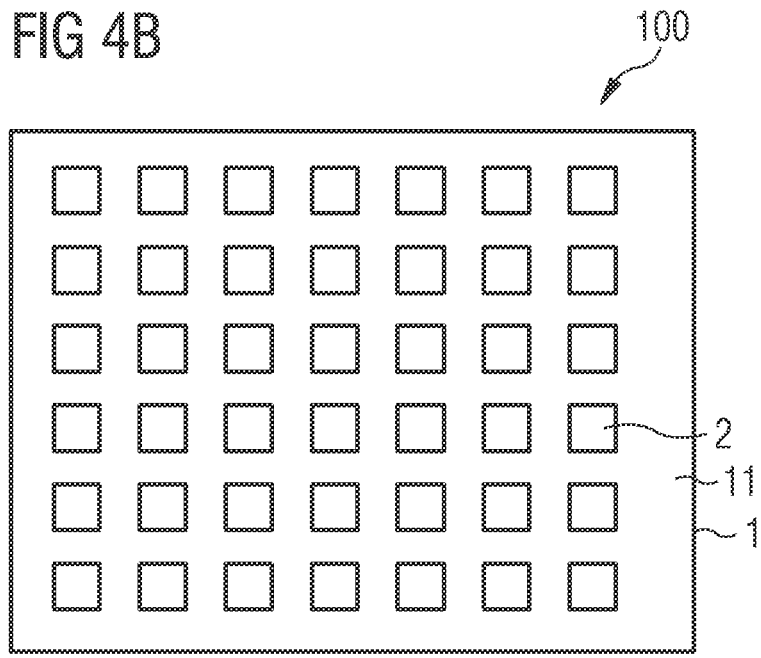

OPTOELECTRONIC SEMICONDUCTOR BODY AND METHOD FOR PRODUCING AN OPTOELECTRONIC SEMICONDUCTOR BODY

CROSS-REFERENCE OF RELATED APPLICATIONS

This application is a continuation of the U.S. National Phase application Ser. No. 15/561,509 filed on Sep. 25, 2017 under 35 U.S.C. § 371 of International Patent Application No. PCT/EP2016/056649, filed on Mar. 24, 2016, which in turn claims the benefit of German Application No. 10 2015 104 665.2 filed on Mar. 26, 2015 the entire disclosures of which are incorporated by reference herein.

DESCRIPTION

An optoelectronic semiconductor body is provided. In addition, a method for producing an optoelectronic semiconductor body is provided.

This patent application claims the priority of German patent application 10 2015 104 665.2, the disclosure content of which is hereby incorporated by reference.

An object to be achieved consists in providing an optoelectronic semiconductor body in which the injection of charge carriers into the active layer is particularly effective. A further object to be achieved consists in providing a method for producing such an optoelectronic semiconductor body.

These objects are achieved by the subject and the method according to the independent claims. Advantageous configurations and developments are provided by the dependent claims.

According to at least one embodiment, the optoelectronic semiconductor body comprises a semiconductor layer sequence having a first layer of a first conductivity type, a second layer of a second conductivity type and an active layer, which is arranged between the first layer and the second layer. The active layer is designed to emit or absorb electromagnetic radiation when operated as intended and then e.g. to convert it to an electronic or optical signal. The first layer can be e.g. a p-doped layer, which comprises holes as charge carriers. The second layer is then e.g. an n-doped layer having electrons as charge carriers. Alternatively, however, the two layers can also be oppositely or identically doped, e.g. n- or p-doped. The conductivity type here and below relates to the majority charge carriers, i.e. electrons in n-doped layers and holes in p-doped layers.

The first and/or second layer here can each also be understood in particular as a layer sequence composed of multiple individual layers. For example, the first layer comprises all the semiconductor layers between a first main side of the semiconductor layer sequence and the active layer. The second layer can comprise e.g. all the layers between a second main side of the semiconductor layer sequence, which is opposite the first main side, and the active layer.

The semiconductor layer sequence is based e.g. on a III/V compound semiconductor material. The semiconductor material is e.g. a nitride compound semiconductor material, such as $Al_n In_{1-n-m} Ga_m N$, or a phosphide compound semiconductor material, such as $Al_n In_{1-n-m} Ga_m P$, or an arsenide compound semiconductor material, such as $Al_n In_{1-n-m} Ga_m As$ or $Al_n In_{1-n-m} Ga_m AsP$, wherein in each case $0 \leq n \leq 1$, $0 \leq m \leq 1$ and $m+n \leq 1$. The semiconductor layer sequence here can comprise dopants and additional constituents. For the sake of simplicity, however, only the essential constituents of the crystal lattice of the semiconductor layer sequence, i.e. Al, As, Ga, In, N or P, are specified, even if these can be partly replaced and/or supplemented by small quantities of other substances. The semiconductor layer sequence is preferably based on AlInGaN.

The active layer of the semiconductor layer sequence contains in particular at least one p-n junction and/or at least one quantum well structure. A radiation generated by the active layer during operation is in particular in the spectral range of between 400 nm and 800 nm inclusive.

According to at least one embodiment, the semiconductor body comprises a plurality of injection regions, which are arranged adjacent to one another in a lateral direction, wherein within each injection region the semiconductor layer sequence is doped in such a way that the semiconductor layer sequence has the same conductivity type as the first layer within the entire injection region. The injection region is therefore a doped sub-region of the semiconductor layer sequence, e.g. a p-doped region if the first layer is also p-doped. The lateral direction here is to be understood in particular as a direction parallel to a main extension direction of the semiconductor layer sequence.

According to at least one embodiment, each injection region, starting from the first layer, extends into the active layer and passes through the active layer at least partly or completely. Each injection region here is preferably surrounded laterally by a continuous track of the active layer, wherein in the continuous track around the injection region the active layer is doped less than in the injection region or oppositely thereto. The injection region is therefore limited or defined in a lateral direction by a junction between a doped region and a less or oppositely doped region.

In a cross-sectional view of a section along the active layer, the injection region can have e.g. circular, oval, hexagonal or rectangular cross-sectional shapes. In this view, the injection region is preferably surrounded completely and uninterruptedly by the active layer.

Preferably, each injection region differs from the rest of the semiconductor layer sequence surrounding it, in particular from the active layer surrounding it, only by the degree or type of doping. The material compositions of the semiconductor layer sequence and the injection regions in this case are, for example, identical apart from the concentration of the dopant. Furthermore, the geometric disposition of the layers of the semiconductor layer sequence is preferably not affected by the injection region.

It is also possible, however, that the concentration of essential constituents of the crystal lattice is altered within the injection region by the high degree of doping. In particular, the high degree of doping can lead to the migration in or out of essential constituents of the crystal lattice, such as e.g. of indium in an AlInGaN semiconductor layer sequence. This process is known as segregation. The indium content within an injection region is then increased or reduced compared with the indium content of the adjacent semiconductor layer sequence, e.g. by at least 10% or 50%.

According to at least one embodiment, during operation of the semiconductor body at least some charge carriers pass from the first layer into the injection regions and are injected from there directly into the active layer. The injection regions and the adjacent active layer are thus in direct electrical contact with one another and are not spaced apart and electrically insulated from one another by any other layers, such as insulation layers.

In at least one embodiment, the optoelectronic semiconductor body comprises a semiconductor layer sequence having a first layer of a first conductivity type, a second layer of a second conductivity type and an active layer arranged between the first layer and the second layer, which absorbs or emits electromagnetic radiation when operated as intended. In the semiconductor body, a plurality of injection regions are present which are arranged adjacent to one another in a lateral direction, wherein within each injection region the semiconductor layer sequence is doped in such a way that the semiconductor layer sequence has the same conductivity type as the first layer within the entire injection region. In this case, each injection region, starting from the first layer, passes through the active layer at least partly. Furthermore, each injection region is surrounded laterally by a continuous track of the active layer, in which the active layer is doped less than in the injection region or oppositely thereto. During operation of the semiconductor body, at least some charge carriers pass from the first layer into the injection regions and are injected from there directly into the active layer.

The invention described here is based inter alia on the finding that the internal quantum efficiency of nitride-based LEDs in particular is reduced by poor hole transport. The poor hole transport into the active layer is often inhibited by the barrier height of the quantum wells within the active layer. However, the occurrence of polarization charges also inhibits hole transport.

The invention described here makes use of, inter alia, the idea of doping the active layer in some regions, so that charge carriers, especially holes, can pass from the first layer into the doped regions of the active layer and are injected effectively into the active layer from there, in particular across the entire thickness of the active layer. Thus, when a multiple quantum well structure is used, it becomes possible for charge carriers to be injected preferably uniformly into all the quantum wells. This increases the efficiency of the entire semiconductor body.

According to at least one embodiment, the injection regions are superimposed on the grown semiconductor layer sequence. In other words, the semiconductor layer sequence is first grown completely and only after the growth are the injection regions introduced by means of a doping process. The consequence of this is in particular that the geometric disposition, especially of the active layer, is not affected by the position and shape of the injection regions. The injection regions are therefore doped sub-regions within the semiconductor layer sequence, which are superimposed on the semiconductor layer sequence.

As a result, the positions of the injection regions are uncorrelated to positions of any crystal imperfections within the semiconductor layer sequence, even on average. These crystal imperfections can be present e.g. in the form of lattice dislocations. Lattice dislocations occur e.g. during the growth of the semiconductor layer sequence as a result of adaptation of the lattice constant to the growth substrate. Preferably, these crystal imperfections or lattice dislocations are distributed purely statistically and therefore do not exhibit a regular geometric arrangement within the semiconductor layer sequence.

In the case of GaN-based semiconductor materials, the lattice dislocation density for growth on a sapphire substrate is typically $10^7$ to $10^9$ per $cm^2$, but for growth on a GaN substrate the lattice dislocation density can be several orders of magnitude lower.

In the case of nitride-based semiconductor materials in particular, V-shaped notches, so-called V-pits, occur in the active layer as a result of these lattice dislocations. These notches in the active layer typically have depths perpendicular to the main extension direction of the active layer of at least 30 nm or at least 100 nm.

In the invention described here, these V-pits occurring during growth of the semiconductor layer sequence preferably have no correlation whatsoever to the injection regions. In other words, the position of the V-pits is, on average, uncorrelated to the position of the injection regions.

According to at least one embodiment, the probability of finding a lattice dislocation of the semiconductor layer sequence, in particular a V-pit, within an injection region is no more than 50% or no more than 10% or no more than 1%.

According to at least one embodiment, the active layer runs continuously in a planar manner within at least 50% or at least 90% or at least 99% of the injection regions. A continuously planar manner in this context means that, within the entire injection region, the active layer has no steps or structures or notches having a depth perpendicular to the main extension direction of the active layer of more than 10 nm or more than 20 nm. Alternatively or in addition, on average at least 50% or 90% or 99% of the area of the active layer is of a planar configuration within each injection region.

According to at least one embodiment, each injection region has a doping concentration of at least $10^{18}$ or $10^{19}$ or $10^{20}$ or $10^{21}$ doping atoms per $cm^3$. This doping concentration is preferably present within the entire injection region.

According to at least one embodiment, the doping concentration within the active layer outside the injection regions is at least two times or at least five times or at least ten times lower than that in the injection regions or is opposite thereto. In the case of GaN-based semiconductor materials, the active layer is slightly n-doped, for example, and the injection regions are then preferably p-doped.

According to at least one embodiment, the active layer has a quantum well structure with at least one or multiple quantum well layers. Between every two adjacent quantum well layers, for example, at least one barrier layer is then arranged. The band gaps between valence band and conduction band here are smaller in the region of the quantum well layer than in the region of the barrier layer. By means of the width of the quantum well layer and the band gap occurring in the quantum well layer, the wavelength of the radiation emitted during recombination within the quantum well layer can be adjusted. The main extension directions of the barrier layers and of the quantum well layers here run substantially parallel to the main extension direction of the active layer. The width is measured perpendicular to the main extension direction.

The presence of the injection regions within the quantum well structure makes it possible e.g. for charge carriers from the first layer to be injected uniformly to all the quantum well layers during operation, and thus the quantum efficiency of the component is increased compared to components without injection regions.

According to at least one embodiment, the injection regions taper in a direction away from the first layer. For example, the injection regions can be formed in a pyramid shape, cone shape or dome shape. Hemispheres or hemispheroids are also conceivable.

According to at least one embodiment, the injection regions pass through the active layer completely and project into the second layer at least partly. Preferably, the injection regions here project at least 50 nm or at least 100 nm or at least 150 nm into the second layer. Alternatively or in addition, the injection regions project no more than 300 nm or no more than 250 nm or no more than 200 nm into the second layer.

According to at least one embodiment, the semiconductor layer sequence is based on a nitride compound semiconductor material; in particular, all the layers of the semiconductor layer sequence are based on a nitride compound semiconductor material.

According to at least one embodiment, the first layer and the injection regions are p-doped and comprise holes as a first conductivity type.

The active layer can comprise e.g. a quantum well structure based on AlGaInN.

According to at least one embodiment, in a top view of the active layer, the injection regions are arranged at lattice points of a regular lattice. In particular, the injection regions in this case are distributed along the active layer in the form of a matrix or hexagonally. The arrangement of the injection regions along the active layer is therefore preferably not random, but follows a pattern and is periodic or regular.

According to at least one embodiment, the injection regions have a diameter or a width of at least 100 nm or at least 150 nm or at least 200 nm in each case, measured in a lateral direction, within the active layer. Alternatively or in addition, the diameter or width of the injection regions is no more than 500 nm or no more than 250 nm or no more than 200 nm. The diameter or width here is e.g. the maximum or average diameter or the maximum or average width.

According to at least one embodiment, the first layer has a thickness perpendicular to the main extension direction of the semiconductor layer sequence of no more than 1 µm, preferably no more than 0.5 µm. The thickness of the second layer is preferably in the range of between 3 µm and 6 µm inclusive. The thickness of the active layer is e.g. between 50 nm and 200 nm inclusive and can comprise e.g. five to ten quantum well layers.

According to at least one embodiment, the surface coverage density of the injection regions along the entire active layer is at least 0.5% or at least 1% or at least 2%. Alternatively or in addition, the surface coverage density is no more than 30% or no more than 10% or no more than 3%. On the one hand, the selection of such a surface coverage density permits effective injection of the charge carriers into the active layer and on the other hand, enough of the active layer remains free from injection regions to guarantee high luminous efficiency.

According to at least one embodiment, the doping concentration is homogeneous and constant within each entire injection region. Alternatively, the doping concentration can also exhibit a gradient within the injection regions, e.g. such that the doping concentration decreases continuously in a lateral direction from the inside towards the outside. A gradient of the doping concentration perpendicular to the main extension direction of the active layer is also conceivable. In this case, for example, the doping concentration decreases within the injection region in a direction away from the first layer.

According to at least one embodiment, the semiconductor layer sequence is applied on a carrier. The carrier here can be applied on a side of the semiconductor layer sequence facing away from or towards the first layer. In particular, the carrier can be the growth substrate for the semiconductor layer sequence or an auxiliary carrier applied afterwards. The carrier serves in particular to stabilize and mechanically support the semiconductor layer sequence. In this case, for example, the semiconductor body takes the form of a self-supporting surface emitter or volume emitter. It is possible, for example, that the semiconductor body is a sapphire chip or a thin-film chip.

In addition, a method for producing an optoelectronic semiconductor body is provided. The method is suitable in particular for producing an optoelectronic semiconductor body as described here. This means that all features disclosed in connection with the optoelectronic semiconductor body are also disclosed for the method and vice versa.

According to at least one embodiment, the method for producing an optoelectronic semiconductor body comprises a step A, in which a semiconductor layer sequence of a first layer of a first conductivity type, a second layer of a second conductivity type and an active layer, which is arranged between the first layer and the second layer, is provided, wherein electromagnetic radiation is absorbed or emitted by the active layer when operated as intended.

In a subsequent step B, the semiconductor layer sequence is then doped in a targeted manner in at least one laterally defined and laterally limited injection region. Doping is carried out in step B here in such a way that the semiconductor layer sequence has the same conductivity type as the first layer within the entire injection region. Preferably, the injection region produced in this way passes through the active layer at least partly, starting from the first layer. After the doping in step B, the injection region is then e.g. laterally surrounded partly or completely by a continuous and uninterrupted track of the active layer, in which the active layer is doped less than in the injection region or oppositely thereto.

According to at least one embodiment, in step B a mask is applied on to the side of the first layer facing away from the active layer. The mask here preferably has at least one window, in which the semiconductor layer sequence is exposed. Regions of the semiconductor layer sequence outside the window are covered by the mask.

According to at least one embodiment, the doping takes place by an ion implantation process, wherein doping atoms are fired on to the mask from a side of the mask facing away from the active layer. A doping of the semiconductor layer sequence then takes place in the region of the window, preferably exclusively in the region of the window. Doping underneath the mask is preferably suppressed, in particular completely suppressed, by the mask.

According to at least one embodiment, a mask layer is first applied on to the semiconductor layer sequence for the production of the mask. The mask is then patterned by means of a lithographic method, such as a stepper method or a nanoimprint lithographic method, and the at least one window in the mask layer is created during this process.

According to at least one embodiment, the mask comprises or consists of a metal, such as gold, silver, aluminum, titanium or steel. It is also conceivable for the mask to be formed using a photoresist or to comprise a photoresist.

According to at least one embodiment, after the ion implantation process for doping the injection regions, the semiconductor layer sequence is subjected to a thermal annealing process. During this annealing process, some imperfections or lattice defects, which are created by the ion implantation process, can be reversed or annealed. As a result, the optical efficiency of the semiconductor body can in turn be increased. For the annealing process, the semiconductor layer sequence is heated e.g. to a temperature of at least 1000° C.

According to at least one embodiment, the semiconductor layer sequence is grown on a growth substrate before step A, wherein firstly the second layer is grown, then the active layer and then the first layer. This is followed by the doping of the semiconductor layer sequence in step B from a side facing away from the growth substrate, e.g. by means of ion implantation. After step B, e.g. an auxiliary carrier is then applied on to the side of the semiconductor layer sequence facing away from the growth substrate and the growth substrate is detached. In this way, for example a thin-film semiconductor chip having the above-mentioned injection regions can be produced. Alternatively, however, the growth substrate can also remain in the semiconductor body and an auxiliary carrier can be omitted. In this way, for example a volume semiconductor chip, such as a sapphire chip, could be produced. The growth substrate can be e.g. a silicon or GaAs or GaN or SiC or sapphire growth substrate.

An optoelectronic semiconductor body as described here and a method for producing an optoelectronic semiconductor body are explained in more detail below with reference to drawings with the aid of exemplary embodiments. The same reference numbers relate to the same elements in the individual figures. However, relationships are not shown to scale; rather, to aid understanding, the size of individual elements may be exaggerated.

Figure 1B:
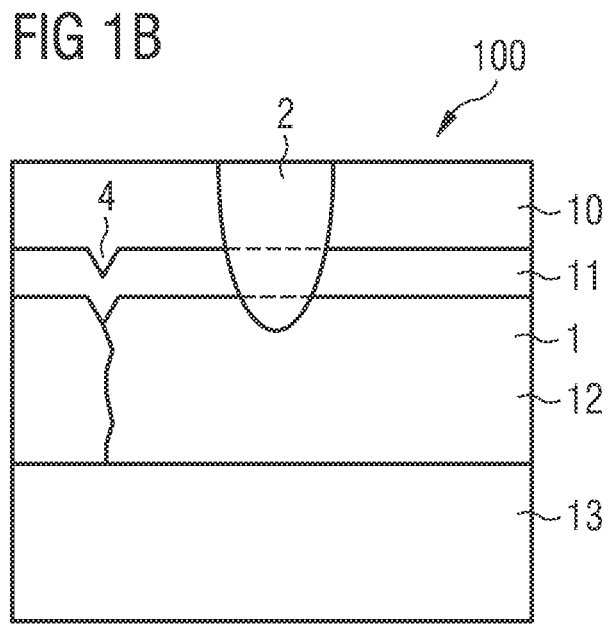
Figure 3A:
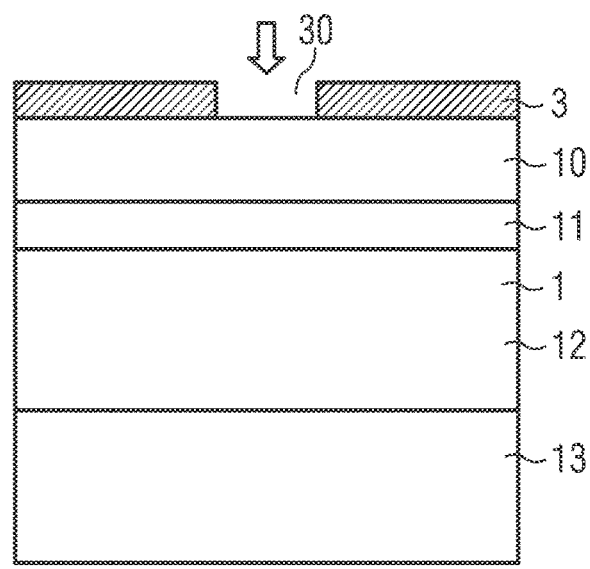
Figure 3B:
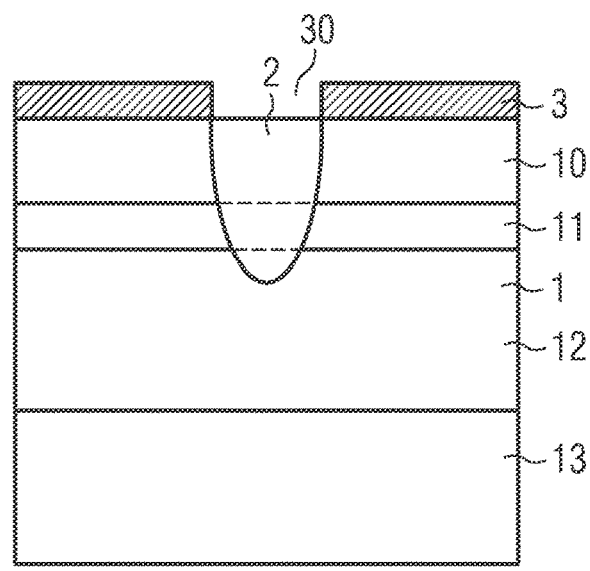
Figure 3C:
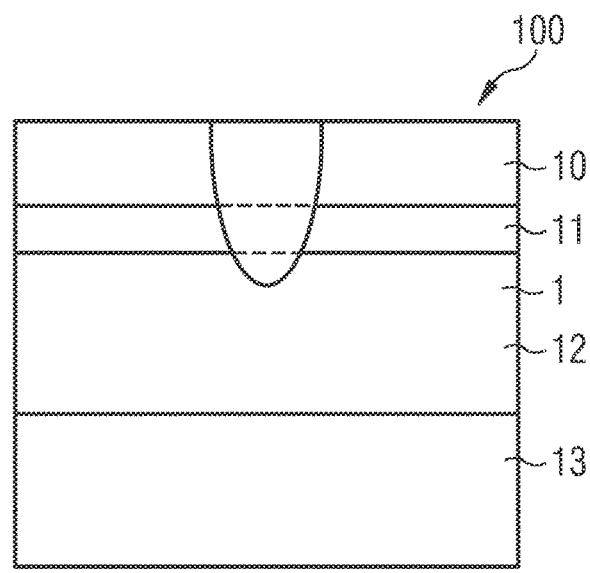

The figures show the following:

FIGS. 1A, 4A and 4B show exemplary embodiments of an optoelectronic semiconductor body in top view, FIGS. 1B, 1C and 2 show exemplary embodiments of an optoelectronic semiconductor body in cross-sectional view and FIGS. 3A to 3C show exemplary embodiments of method steps for producing an optoelectronic semiconductor body in a cross-sectional view.

In FIG. 1A, an optoelectronic semiconductor body 100 is shown in a top view of an active layer 11 of a semiconductor layer sequence 1 of the optoelectronic semiconductor body 100. The active layer 11 is interspersed by injection regions 2, which in the present case are arranged regularly in a rectangular or square matrix pattern. The injection regions 2 here have a circular or elliptical cross-sectional area. In particular, the injection regions 2 in FIG. 1A are not distributed randomly within the semiconductor layer sequence 1 but are arranged at fixed lattice points of a regular lattice.

FIG. 1B shows an exemplary embodiment of an optoelectronic semiconductor body 100 along the line AA' from FIG. 1A. It can be seen that the semiconductor body 100 comprises a carrier 13, on which a semiconductor layer sequence 1 is applied. The semiconductor layer sequence 1 can be grown e.g. on a main side of the carrier 13. The carrier 13 is e.g. the growth substrate for the semiconductor layer sequence 1. The carrier 13 is e.g. a sapphire carrier and the semiconductor layer sequence 1 is based e.g. on AlIn-GaN.

The semiconductor layer sequence 1 comprises a first layer 10 of a first conductivity type, an active layer 11 and a second layer 12 of a second conductivity type, wherein the active layer 11 is arranged between the first layer 10 and the second layer 12 and the second layer 12 faces towards the carrier 13. In the present case, the first layer 10 is e.g. p-doped and the second layer 12 is e.g. n-doped. The active layer 11 can be undoped or e.g. slightly n-doped.

In FIG. 1B, in addition, the cross-section of the injection region 2 from FIG. 1A can be seen. The injection region 2 is a doped sub-region of the semiconductor layer sequence 1, wherein the doping is selected such that within the entire injection region 2 the same conductivity type is present as in the first layer 10. For example, the injection region 2, like the first layer 10, is p-doped and comprises holes as the majority charge carriers. The doping concentration within the injection region 2 is e.g. at least $10^{18}$ doping atoms per cm$^3$. The doping atoms are e.g. Mg.

The injection region 2 is superimposed on the semiconductor layer sequence 1 in such a way that the position and geometric shape of the injection region 2 has no effect on the disposition of the layers within the semiconductor layer sequence 1. In particular, the injection region 2 is based on the same basic material as the semiconductor layer sequence 1 and is additionally doped or more strongly doped only by comparison with the rest of the semiconductor layer sequence 1. The active layer 11 runs continuously in a planar manner within the entire injection region 2 and has no steps or notches with a vertical extension of more than 20 nm. Vertical here refers to a direction perpendicular to the main extension direction of the active layer 11. In particular, no lattice defect, e.g. in the form of a V-pit 4, is present within the injection region 2. The probability of finding a lattice defect, such as a lattice dislocation or a V-pit 4, at all within an injection region 2 is preferably no more than 50%. A V-pit 4 is arranged laterally adjacent to the injection region 2. The V-pit 4 is a V-shaped notch in the active layer 11 in a cross-sectional view.

The injection region 2 in FIG. 1B extends through the entire first layer 10 and the entire active layer 11 and projects partly, e.g. at least 50 nm, into the second layer 12. The injection region 2 here tapers in a direction away from the first layer 10. Laterally, i.e. parallel to a main extension direction of the semiconductor layer sequence 1, the injection region 2 is completely surrounded by a continuous and uninterrupted track of the active layer 11, in which the degree of doping is opposite to or at least two orders of magnitude smaller than that in the region of the injection region 2. In the present case, the cross-sectional shape of the injection region 2 is dome-shaped.

In FIG. 1C, a cross-sectional view through the semiconductor body 100 along the line BB' from FIG. 1A is shown. The line BB' here does not cross the injection region 2 of the semiconductor layer sequence 1. The layer construction of the semiconductor layer sequence 1 is identical to the layer construction of FIG. 1B, apart from the injection region 2. In particular, the geometric disposition of the active layer 11 in FIG. 1B is identical to that in FIG. 1C apart from the randomly occurring V-pit 4 in FIG. 1B. This makes it clear that the disposition of the active layer 11 is not affected by the position and shape of the injection region 2.

In FIG. 2, an exemplary embodiment of the semiconductor body 100 is shown, again in a cross-sectional view. In the present case, the active layer 11 is formed from a quantum well structure having a plurality of quantum well layers 110 and barrier layers 111, which are stacked one on top of another in an alternating manner. The active layer 11 here has e.g. a thickness of between 50 nm and 200 nm inclusive. The quantum well layers 110 each have e.g. a thickness of between 2 nm and 10 nm inclusive. The quantum well structure of FIG. 2 is based e.g. on AlInGaN and comprises between ten and twenty quantum well layers 110. The band gaps within the quantum well layers 110 here are preferably smaller than those within the barrier layers 111.

Furthermore, FIG. 2 shows the flow of charge carriers within the layers of the semiconductor layer sequence 1 during operation of the semiconductor body 100. First charge carriers, e.g. holes, are injected from the first layer 10 into the injection region 2. From the injection region 2, the first charge carriers can pass directly into the active layer 11. The first charge carriers here are distributed to all the quantum well layers 110, so that first charge carriers are injected into each quantum well layer 110. The first charge carriers are therefore preferably distributed to all the quantum well layers 110, in particular uniformly. Furthermore, second charge carriers, e.g. electrons, are also injected from the second layer 12 into the active layer 11 and the associated quantum well layers 110. Within the quantum well layers 110, recombination of the electrons and holes can then take place, resulting in electromagnetic radiation preferably in the UV range or in the visible range. The injection region 2 makes it possible here for radiation to be generated in all the quantum well layers 110, so that the quantum efficiency of the semiconductor body 100 is increased by comparison with semiconductor bodies without injection regions.

In the exemplary embodiments of FIGS. 3A to 3C, various method steps for producing an optoelectronic semiconductor body 100 are shown. The semiconductor body 100 here is viewed in cross-section in each case.

In FIG. 3A, a semiconductor layer sequence 1 is first provided on a carrier 13. The order of the individual layers of the semiconductor layer sequence 1 here corresponds to the order from FIG. 1C. On a side of the first layer 10 facing away from the carrier 13, a mask 3, e.g. composed of a metal, such as aluminum or silver or gold, is also applied. The mask 3 further comprises a window 30, in which the side of the semiconductor layer sequence 1 facing away from the carrier 13 is exposed. The rest of the semiconductor layer sequence 1 is covered with the mask 3.

Furthermore, FIG. 3A illustrates the beginning of an ion implantation process, in which e.g. ionized magnesium atoms are fired on to a side of the mask 3 facing away from the carrier 13.

FIG. 3B shows a method step after completion of the doping operation by means of ion implantation. As a result of the doping operation, an injection region 2 has been formed in the region of the window 30, in which the semiconductor layer sequence 1 is doped. Underneath the mask 3, in regions outside the window 30, no doping or a lower doping of the semiconductor layer sequence 1 has taken place. The mask 3 has therefore screened off or intercepted the ions from the ion implantation process.

FIG. 3C shows the same exemplary embodiment as in FIG. 3B, but the mask 3 has been removed after the doping process. The finished optoelectronic semiconductor body 100 remains.

FIGS. 4A and 4B show further exemplary embodiments of an optoelectronic semiconductor body 100 in a top view of the active layer 11 of the semiconductor layer sequence 1. In FIG. 4A, the injection regions 2 are arranged in a regular hexagonal pattern, while in FIG. 4B the injection regions 2 are arranged in a square matrix pattern. In FIG. 4A, the injection regions 2 have a round or oval cross-sectional shape, whereas in FIG. 4B the injection regions 2 have square cross-sectional shapes. The arrangement of the injection regions 2 and the geometric cross-sectional shape of the injection regions 2 can be determined by means of the geometric shape and arrangement of the windows 30 in the mask 3.

Furthermore, FIG. 4A shows a plurality of lattice dislocations 4 in the form of V-pits 4, which have been formed in the semiconductor layer sequence 1 as a result of the growth. The V-pits 4 here are distributed randomly in the semiconductor layer sequence 1 and not regularly or periodically. In particular, the positions of the injection regions 2 do not correlate with the positions of the V-pits 4.

The description with the aid of the exemplary embodiments does not limit the invention thereto. Rather, the invention comprises any new feature and any combination of features, which in particular includes any combination of features in the patent claims, even if these features or this combination are not themselves explicitly stated in the patent claims or exemplary embodiments.

LIST OF REFERENCE NUMBERS

1 Semiconductor layer sequence
2 Injection region
3 Mask
4 Lattice dislocations/V-pits
10 First layer
11 Active layer
12 Second layer
13 Carrier
30 Window
100 Optoelectronic semiconductor body
110 Quantum well layer
111 Barrier layer

The invention claimed is:

1. An optoelectronic semiconductor body, comprising
a semiconductor layer sequence with a first layer of a first conductivity type, a second layer of a second conductivity type and an active layer, which is arranged between the first layer and the second layer and which absorbs or emits electromagnetic radiation when operated as intended,
at least one injection region, which is superimposed on the grown semiconductor layer sequence, wherein the semiconductor layer sequence is doped within the at least one injection region such that the semiconductor layer sequence has the same conductivity type as the first layer within the entire injection region, wherein
the at least one injection region passes through the active layer completely starting from the first layer and projects into the second layer at least partly and the at least one injection region is surrounded laterally partly or completely by a continuous track of the active layer, in which the active layer is doped less than in the injection region or oppositely thereto,
during operation, charge carriers reach the at least one injection region at least partly from the first layer and are directly injected into the active layer from there.

2. The optoelectronic semiconductor body according to claim 1,
wherein
the at least one injection region is superimposed on the grown semiconductor layer sequence in such a way that, on average, positions of the at least one injection region are uncorrelated to positions of any crystal imperfections in the semiconductor layer sequence.

3. The optoelectronic semiconductor body according to claim 1,
wherein
the probability of finding a lattice dislocation of the semiconductor layer sequence within the at least one injection region is no more than 50%.

4. The optoelectronic semiconductor body according to claim 1,
wherein
within the at least one entire injection region, a doping concentration of at least $10^{18}$ doping atoms per $cm^3$ is present,
the doping concentration within the active layer outside the at least one injection region is at least two orders of magnitude lower than that in the at least one injection region or is opposite thereto.

5. The optoelectronic semiconductor body according to claim 1,
wherein
the active layer has a quantum well structure with at least one quantum well layer,
between every two adjacent quantum well layers, at least one barrier layer is arranged,
the band gap between valence band and conduction band is smaller in the region of the quantum well layer than in the region of the barrier layer,
the main extension directions of the barrier layer and the quantum well layer run substantially parallel to a main extension direction of the semiconductor layer sequence.

6. The optoelectronic semiconductor body according to claim 1,
wherein
the at least one injection region tapers in a direction away from the first layer,
the at least one injection region passes through the active layer completely and projects into the second layer,
the at least one injection region projects at least 50 nm and no more than 300 nm into the second layer.

7. The optoelectronic semiconductor body according to claim 1,
wherein
the semiconductor layer sequence is based on a nitride compound semiconductor material,
the first layer and the at least one injection region are p-doped and comprise holes as the first conductivity type.

8. The optoelectronic semiconductor body according to claim 1,
wherein
the at least one injection region has a diameter of at least 100 nm and no more than 500 nm in a lateral direction within the active layer.

9. The optoelectronic semiconductor body according to claim 1,
wherein
the surface coverage density of the at least one injection region is between 0.5% and 30% inclusive along the entire active layer.

10. The optoelectronic semiconductor body according to claim 1,
wherein
the at least one injection region tapers in a direction away from the first layer and is formed in a dome shape,
within the at least one injection region the doping concentration decreases continuously in a lateral direction from the inside to the outside.

11. The optoelectronic semiconductor body according to claim 1,
wherein
the semiconductor layer sequence is applied on a carrier,
the carrier is applied on a side of the semiconductor layer sequence facing away from or towards the first layer,
the semiconductor body is in the form of a surface emitter or volume emitter.

12. The optoelectronic semiconductor body according to claim 1, wherein the semiconductor layer sequence is an AlInGaN semiconductor layer sequence and the content of indium within the at least one injection region is increased or decreased with respect to the content of indium in the adjacent semiconductor layer sequence.

13. A method for producing an optoelectronic semiconductor body, comprising the steps of:
A) providing a semiconductor layer sequence with a first layer of a first conductivity type, a second layer of a second conductivity type and an active layer, which is arranged between the first layer and the second layer and which absorbs or emits electromagnetic radiation when operated as intended;
B) doping the semiconductor layer sequence in a targeted manner in at least one laterally defined and laterally limited injection region of the semiconductor layer sequence, wherein
in step B) doping is carried out in such a way that the semiconductor layer sequence has the same conductivity type as the first layer within the entire injection region,
the injection region passes through the active layer at least partly starting from the first layer,
after the doping in step B), the injection region is laterally surrounded partly or completely by a continuous track of the active layer in which the active layer is doped less than in the injection region or oppositely thereto.

14. The method according to claim 13,
wherein
before step B) a mask is applied on to the side of the first layer facing away from the active layer,
the mask has at least one window, in which the semiconductor layer sequence is exposed,
the doping takes place by an ion implantation process, wherein doping atoms are fired on to the mask from a side of the mask facing away from the active layer,
a doping of the semiconductor layer sequence takes place in the region of the window,
a doping of the semiconductor layer sequence underneath the mask is suppressed by the mask.

15. The method according to claim 14,
wherein
for the production of the mask a mask layer is first applied on to the semiconductor layer sequence,
then, at least the one window is created in the mask layer by means of a lithographic method or a nano-imprint lithographic method,
the mask comprises a metal.

16. The method according to claim 14,
wherein after the ion implantation process the semiconductor layer sequence is subjected to a thermal annealing process.

17. The method according to claim 13, wherein
the semiconductor layer sequence is grown on a growth substrate before step A), wherein firstly the second layer is grown, then the active layer and then the first layer,
the doping of the semiconductor layer sequence in step B) takes place from a side facing away from the growth substrate,
after step B) an auxiliary carrier is applied on to the side of the semiconductor layer sequence facing away from the growth substrate and the growth substrate is detached.

18. The method according to claim 13, wherein in step B) doping is carried out in such a way that the injection region passes through the active layer completely starting from the first layer and projects into the second layer at least partly.

* * * * *